(12) United States Patent
Arakawa et al.

(10) Patent No.: US 8,363,326 B2
(45) Date of Patent: Jan. 29, 2013

(54) $AL_XGA_{(1-x)}N$ SINGLE CRYSTAL, METHOD OF PRODUCING $ALXGA_{(1-x)}N$ SINGLE CRYSTAL, AND OPTICAL LENS

(75) Inventors: Satoshi Arakawa, Itami (JP); Takashi Sakurada, Itami (JP); Yoshiyuki Yamamoto, Itami (JP); Issei Satoh, Itami (JP); Keisuke Tanizaki, Itami (JP); Hideaki Nakahata, Itami (JP); Naho Mizuhara, Itami (JP); Michimasa Miyanaga, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 141 days.

(21) Appl. No.: 13/001,723

(22) PCT Filed: Jun. 25, 2009

(86) PCT No.: PCT/JP2009/061609
§ 371 (c)(1),
(2), (4) Date: Dec. 28, 2010

(87) PCT Pub. No.: WO2010/001803
PCT Pub. Date: Jan. 7, 2010

(65) Prior Publication Data
US 2011/0109973 A1    May 12, 2011

(30) Foreign Application Priority Data

Jul. 1, 2008  (JP) .................................. 2008-172562

(51) Int. Cl.
G02B 1/02 (2006.01)
(52) U.S. Cl. ........................................ 359/642; 257/98

(58) Field of Classification Search .................. 359/642; 257/98
See application file for complete search history.

(56) References Cited

U.S. PATENT DOCUMENTS

| 6,259,567 B1 | 7/2001 | Brown et al. |
| 2004/0221799 A1 | 11/2004 | Nakayama et al. |

(Continued)

FOREIGN PATENT DOCUMENTS

| CN | 1549357 A | 11/2004 |
| JP | 2002-531871 | 9/2002 |

(Continued)

OTHER PUBLICATIONS

S. Watanabe et al., "A 1 Ko Sosei AlGaN no Kussetsuritsu", Dai 49 Kai Extended Abstracts, Japan Society of Applied Physics and Related Societies, Mar. 2002, p. 396, 29p-ZM-14, partial translation.

*Primary Examiner* — William Choi
(74) *Attorney, Agent, or Firm* — Drinker Biddle & Reath LLP (57) ABSTRACT

A method of producing an $Al_xGa_{(1-x)}N$ ($0 < x \leq 1$) single crystal of the present invention is directed to growing an $Al_xGa_{(1-x)}N$ single crystal by sublimation. The method includes the steps of preparing an underlying substrate, preparing a raw material of high purity, and growing an $Al_xGa_{(1-x)}N$ single crystal on the underlying substrate by sublimating the raw material. At the $Al_xGa_{(1-x)}N$ single crystal, the refractive index with respect to light at a wavelength greater than or equal to 250 nm and less than or equal to 300 nm is greater than or equal to 2.4, and the refractive index with respect to light at a wavelength greater than 300 nm and less than 350 nm is greater than or equal to 2.3, measured at 300K.

9 Claims, 4 Drawing Sheets

U.S. PATENT DOCUMENTS

2007/0243653 A1 10/2007 Morgan et al.
2008/0251808 A1* 10/2008 Kususe et al. .................. 257/98

FOREIGN PATENT DOCUMENTS

| | | |
|---|---|---|
| JP | 2003-161801 | 6/2003 |
| JP | 3581145 | 7/2004 |
| JP | 2006-315940 | 11/2006 |
| WO | 00/33121 | 6/2000 |
| WO | 2007/123735 | 11/2007 |

* cited by examiner

ALXGA$_{(1-x)}$N SINGLE CRYSTAL, METHOD OF PRODUCING ALXGA$_{(1-x)}$N SINGLE CRYSTAL, AND OPTICAL LENS

TECHNICAL FIELD

The present invention relates to an Al$_x$Ga$_{(1-x)}$N single crystal, a method of producing an Al$_x$Ga$_{(1-x)}$N single crystal, and an optical lens.

BACKGROUND ART

In accordance with the demand for a larger storage capacity of optical recording media (including magneto-optical storage medium) as typified by DVDs, there is an approach to shorter wavelengths of the optical source used for recording and reproduction as well as reducing the convergent point corresponding to light from a semiconductor laser focused onto a recording medium through a condenser lens. For such a condenser lens is employed glass such as quartz, an oxide such as sapphire, diamond, or the like, exhibiting low absorption with respect to light at a wavelength in the ultraviolet range to the deep ultraviolet range (200 nm to 350 nm). Japanese Patent Laying-Open No. 2003-161801 (Patent Document 1) proposes a fluoride optical material such as BaF$_2$ (barium fluoride), CaF$_2$ (calcium fluoride), LiF (lithium fluoride), and NaF (sodium chloride).

PRIOR ART DOCUMENT

Patent Document

Patent Document 1: Japanese Patent Laying-Open No. 2003-161801

SUMMARY OF THE INVENTION

Problems to be Solved by the Invention

Glass and oxides have a limited numerical aperture due to the low refractive index. Therefore, there was a problem that the convergent point is not small enough. The fluoride optical material disclosed in the aforementioned Patent Document 1 had a low refractive index of 1.3 to 1.5 with respect to light in the ultraviolet range below 350 nm, so that the numerical aperture was limited.

There was also the problem that diamond is disadvantageous from the standpoint of machining such as treating the surface of a small lens due to its hardness.

To date, no material was proposed having both a high refractive index with respect to light in the ultraviolet range to deep ultraviolet range greater than or equal to 200 nm and less than or equal to 350 nm, and machineability. There was also no optical lens such as a condenser lens based on such a material.

Therefore, an object of the present invention is to provide an Al$_x$Ga$_{(1-x)}$N single crystal having a large refractive index and machineability, and a method of producing an Al$_x$Ga$_{(1-x)}$N single crystal.

Means for Solving the Problems

The inventors of the present invention directed their attention to an Al$_x$Ga$_{(1-x)}$N ($0<x\leq1$) single crystal as a material having machineability. As a result of diligent study in order to improve the refractive index of this Al$_x$Ga$_{(1-x)}$N single crystal, the inventors found out that the refractive index of this Al$_x$Ga$_{(1-x)}$N single crystal is relative to the impurity concentration in the Al$_x$Ga$_{(1-x)}$N single crystal.

A method of producing an Al$_x$Ga$_{(1-x)}$N single crystal of the present invention is directed to growing an Al$_x$Ga$_{(1-x)}$N ($0<x\leq1$) single crystal by sublimation, and includes the steps set forth below. An underlying substrate is prepared. A material of high purity is prepared. The raw material is sublimated to grow an Al$_x$Ga$_{(1-x)}$N single crystal on the underlying substrate.

Since an Al$_x$Ga$_{(1-x)}$N single crystal is grown from a raw material of high purity according to the method of producing an Al$_x$Ga$_{(1-x)}$N single crystal of the present invention, the impurities included in the Al$_x$Ga$_{(1-x)}$N single crystal can be reduced. Thus, an Al$_x$Ga$_{(1-x)}$N single crystal of high purity, having the introduction of impurities suppressed, can be grown. There can be produced an Al$_x$Ga$_{(1-x)}$N single crystal having a refractive index greater than or equal to 2.4 with respect to light at a wavelength greater than or equal to 250 nm and less than or equal to 300 nm, and a refractive index greater than or equal to 2.3 with respect to light at a wavelength greater than 300 nm and less than 350 nm, measured at 300K. Since the refractive index is proportional to the numerical aperture, the numerical aperture of the produced Al$_x$Ga$_{(1-x)}$N single crystal can be improved. Further, machining is facilitated since the hardness of Al$_x$Ga$_{(1-x)}$N single crystal is lower than diamond. Thus, an Al$_x$Ga$_{(1-x)}$N single crystal having a large refractive index and machineability can be produced.

As used herein, "raw material of high purity" means that the impurity concentration in the raw material is less than or equal to 0.04 wt %, preferably less than or equal to 0.025 wt %, further preferably less than or equal to 0.01 wt %, under thermal desorption spectroscopy or the like. In other words, the impurities in the raw material correspond to the case where impurities are included not intentionally, but only inevitably, and the case where impurities less than or equal to 0.04 wt % are included.

Preferably in the method of producing an Al$_x$Ga$_{(1-x)}$N single crystal set forth above, the step of growing includes the step of growing an Al$_x$Ga$_{(1-x)}$N single crystal having a thickness greater than or equal to 300 μm.

The inventors of the present invention found out that, when an Al$_x$Ga$_{(1-x)}$N single crystal is grown thick, the dislocation density generated at the grown Al$_x$Ga$_{(1-x)}$N single crystal can be reduced. The inventors found out that the dislocation density can be reduced effectively by particularly growing an Al$_x$Ga$_{(1-x)}$N single crystal having a thickness greater than or equal to 300 μm. Therefore, an Al$_x$Ga$_{(1-x)}$N single crystal having higher refractive index can be grown. Accordingly, the numerical aperture can be further improved.

Preferably in the method of producing an Al$_x$Ga$_{(1-x)}$N single crystal set forth above, the step of preparing includes the step of preparing an underlying substrate having a composition identical to the composition of the Al$_x$Ga$_{(1-x)}$N single crystal.

Accordingly, lattice mismatch and the like between the growing Al$_x$Ga$_{(1-x)}$N single crystal and the underlying substrate can be suppressed, rendering the crystallinity of the growing Al$_x$Ga$_{(1-x)}$N single crystal favorable. Therefore, an Al$_x$Ga$_{(1-x)}$N single crystal having higher refractive index can be grown. Accordingly, the numerical aperture can be further improved.

The Al$_x$Ga$_{(1-x)}$N single crystal ($0<x\leq1$) of the present invention is characterized in that the refractive index with respect to light at a wavelength greater than or equal to 250 nm and less than or equal to 300 nm is greater than or equal to 2.4, and the refractive index with respect to light at a wavelength greater than 300 nm and less than 350 nm is greater than or equal to 2.3, measured at 300K.

By fabricating an $Al_xGa_{(1-x)}N$ single crystal according to the method of producing an $Al_xGa_{(1-x)}N$ single crystal of the present invention set forth above, an $Al_xGa_{(1-x)}N$ single crystal having the impurity concentration reduced can be obtained. Therefore, an $Al_xGa_{(1-x)}N$ single crystal having the above-described high refractive index can be implemented. Accordingly, an $Al_xGa_{(1-x)}N$ single crystal that can have the numerical aperture improved can be implemented. The $Al_xGa_{(1-x)}N$ single crystal is superior in machineability since its hardness is lower than that of diamond. Thus, an $Al_xGa_{(1-x)}N$ single crystal having a large refractive index and machineability can be produced.

Preferably, the $Al_xGa_{(1-x)}N$ single crystal is characterized in that the absorption coefficient with respect to light at a wavelength greater than or equal to 300 nm and less than 350 nm is less than or equal to 27 $cm^{-1}$, measured at 300K.

The inventors of the present invention found out that the O (oxygen) atom contained in the $Al_xGa_{(1-x)}N$ single crystal is substituted with N (nitrogen) atom to become substituted oxygen atom $O_N$, and bonded with the lattice defect (vacancy-type defect $V_{Al}$) of Al (aluminium) atom to constitute a combined defect $V_{Al}$—$O_N$. The combined defect $V_{Al}$—$O_N$ forms a dipole moment. When the $Al_xGa_{(1-x)}N$ single crystal is irradiated with ultraviolet ray, it is rendered active to form an absorption level in the band gap. By producing an $Al_xGa_{(1-x)}N$ single crystal according to the method of producing an $Al_xGa_{(1-x)}N$ single crystal of the present invention set forth above, the oxygen atoms contained can be reduced. Accordingly, the combined defect $V_{Al}$—$O_N$ can be reduced, allowing reduction in the absorption level that is greater than or equal to 250 nm and less than 350 nm in the band gap involved in the combined defect $V_{Al}$—$O_N$. As a result, the absorption coefficient with respect to light at a wavelength greater than or equal to 300 nm and less than 350 nm can be reduced, as set forth above.

Preferably, the $Al_xGa_{(1-x)}N$ single crystal set forth above is characterized in that the dislocation density is less than or equal to $1\times10^6$ $cm^{-2}$.

Since the crystallinity of the $Al_xGa_{(1-x)}N$ single crystal can be improved, the refractive index can be increased. Therefore, the numerical aperture can be further improved.

Preferably, the $Al_xGa_{(1-x)}N$ single crystal set forth above is characterized in that the oxygen concentration is less than or equal to $1\times10^{19}$ $cm^{-3}$.

Accordingly, the oxygen identified as impurities can be further reduced, allowing the refractive index to be increased. Therefore, the numerical aperture can be further improved.

Preferably, the $Al_xGa_{(1-x)}N$ single crystal set forth above is characterized in including a main surface having a surface roughness RMS less than or equal to 100 nm.

Therefore, the reflectance of light at the main surface of the $Al_xGa_{(1-x)}N$ single crystal can be reduced, allowing further improvement in the focusing of light at the aforementioned wavelength.

Preferably, the $Al_xGa_{(1-x)}N$ single crystal set forth above is characterized in that the width or diameter is greater than or equal to 5 mm, and the thickness is greater than or equal to 300 μm.

Accordingly, the size and strength required for an optical lens can be maintained. Further, since the dislocation density can be reduced effectively by taking a thickness greater than or equal to 300 μm, the refractive index can be further increased. Thus, the numerical aperture can be further improved.

An optical lens of the present invention is fabricated using the $Al_xGa_{(1-x)}N$ single crystal set forth above.

Since the optical lens of the present invention employs an $Al_xGa_{(1-x)}N$ single crystal having a high refractive index and superior machining, an optical lens improved in performance can be implemented.

The optical lens preferably includes a flat plane, and a hemispherical round portion extending from the flat plane. The flat plane is a (0001) plane, or a plane parallel to the (0001) plane.

The $Al_xGa_{(1-x)}N$ single crystal is a uniaxial crystal having one optical axis. Therefore, by taking the (0001) plane (c plane) or a face parallel to the (0001) plane that is perpendicular to the optical axis, i.e. c axis, as the incident face, axis deviation caused by birefringence can be suppressed.

The optical lens set forth above preferably includes a flat plane, and a super hemispherical round portion extending from the flat plane. The flat plane is a (0001) plane, or a plane parallel to the (0001) plane.

Accordingly, axis deviation caused by birefringence set forth above can be suppressed. Moreover, the numerical aperture can be further improved since the thickness in the direction along the optical axis can be increased.

Effects of the Invention

According to an $Al_xGa_{(1-x)}N$ single crystal producing method, an $Al_xGa_{(1-x)}N$ single crystal, and an optical lens of the present invention, an $Al_xGa_{(1-x)}N$ single crystal having a large refractive index and machineability can be implemented.

MODES FOR CARRYING OUT THE INVENTION

Embodiments of the present invention will be described hereinafter with reference to the drawings. In the drawings, the same or corresponding elements have the same reference characters allotted, and the description thereof will not be repeated.

First Embodiment

Figure 1:
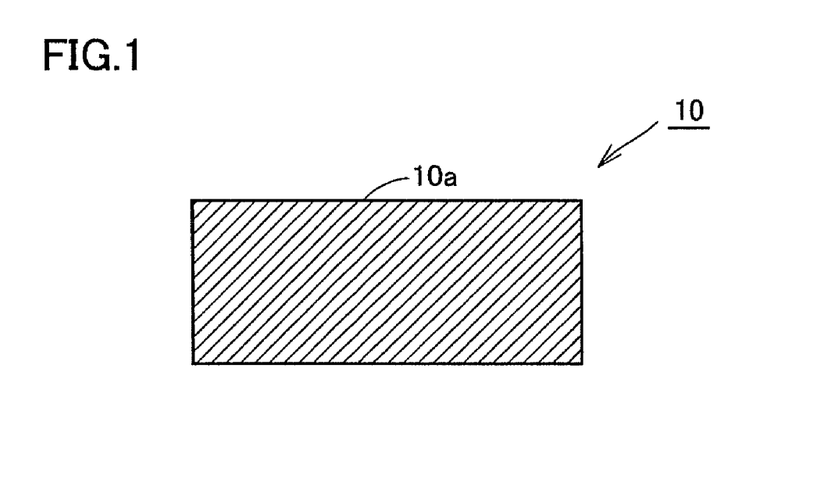
FIG. 1 is a schematic sectional view of an $Al_xGa_{(1-x)}N$ single crystal according to a first embodiment of the present invention.

FIG. 1 is a schematic sectional view of an $Al_xGa_{(1-x)}N$ ($0<x\leq1$) single crystal according to the present embodiment. With reference to FIG. 1, an $Al_xGa_{(1-x)}N$ single crystal of the present embodiment will be first described. The composition ratio x is the mole ratio of Al and Ga.

As shown in FIG. 1, an $Al_xGa_{(1-x)}N$ single crystal 10 includes a main surface 10a. From the standpoint of a size feasible for machining into an optical lens and having mechanical strength, $Al_xGa_{(1-x)}N$ single crystal 10 preferably has a width or diameter greater than or equal to 5 mm and a thickness greater than or equal to 300 μm. From similar standpoints, $Al_xGa_{(1-x)}N$ single crystal 10 preferably has a width or diameter greater than or equal to 10 mm and a thickness greater than or equal to 1000 μm.

As used herein, the width of $Al_xGa_{(1-x)}N$ single crystal 10 implies the distance between two top points specified arbitrarily, opposite to each other at main surface 10a with the center therebetween, when main surface 10a of the single crystal is polygonal. The diameter of $Al_xGa_{(1-x)}N$ single crystal 10 implies the longest length of a diameter specified arbitrarily at main surface 10a, when main surface 10a of the single crystal is circular or elliptical.

Since main surface 10a of $Al_xGa_{(1-x)}N$ single crystal 10 can reduce the reflectance of light therefrom, surface roughness RMS is preferably less than or equal to 100 nm, more preferably less than or equal to 10 nm, and further preferably 1 nm, from the standpoint of further improving the focusing.

As used herein, surface roughness RMS implies the square average roughness of the surface defined at JIS B0601, i.e. the root mean square average of the distance from the average plane to the measurement plane (deviation).

At $Al_xGa_{(1-x)}N$ single crystal 10, the refractive index with respect to light at a wavelength greater than or equal to 250 nm and less than or equal to 300 nm is greater than or equal to 2.4, and the refractive index with respect to light at a wavelength greater than 300 nm and less than 350 nm is greater than or equal to 2.3, measured at 300K. Accordingly, the numerical aperture can be increased. From the standpoint of further increasing the numerical aperture, the refractive index of $Al_xGa_{(1-x)}N$ single crystal 10 with respect to light at a wavelength greater than or equal to 250 nm and less than 350 nm is preferably greater than or equal to 2.4, more preferably greater than or equal to 2.5.

Although the refractive index is preferably as high as possible since the numerical aperture can be improved, the upper limit of the refractive index is 2.6, for example, from the standpoint of feasible fabrication.

As used herein, "refractive index" is a value calculated from the reflectivity, based on a measurement of absolute 5° reflectivity through an ultraviolet-visible spectrophotometer, at the temperature of 300K, for example.

As used herein, the numerical aperture is an index representing the resolution, expressed as $n \sin \theta$, where n is the refractive index and θ is the maximum angle of incidence with respect to the optical axis. In other words, the numerical aperture is a value proportional to the refractive index.

The absorption coefficient of $Al_xGa_{(1-x)}N$ single crystal 10 with respect to light at a wavelength greater than or equal to 300 nm and less than 350 nm is preferably less than or equal to 27 $cm^{-1}$, measured at 300K, from the standpoint of allowing reduction in the absorption level involved in any combined defect $V_{Al}$—$O_N$ by reducing the combined defect $V_{Al}$—$O_N$. From similar standpoints, the absorption coefficient of $Al_xGa_{(1-x)}N$ single crystal 10 with respect to light at a wavelength greater than or equal to 250 nm and less than 300 nm is preferably less than or equal to 10 $cm^{-1}$, measured at 300K.

The "absorption coefficient" is a value calculated from the thickness of $Al_xGa_{(1-x)}N$ single crystal 10 by measuring the transmittance through an ultraviolet-visible spectrophotometer.

The dislocation density of $Al_xGa_{(1-x)}N$ single crystal 10 is preferably less than or equal to $1\times10^6$ $cm^{-2}$, more preferably less than or equal to $5.6\times10^5$ $cm^{-2}$, from the standpoint of improving the refractive index since any combined defect $V_{Al}$—$O_N$ can be further reduced.

The "dislocation density" is a value measured by, for example, the EPD (etch pit) method. In the EPD method, the number of pits caused by etching in, for example, KOH (potassium hydroxide) melt is counted and divided by the unit area.

The oxygen concentration of $Al_xGa_{(1-x)}N$ single crystal 10 is preferably less than or equal to $1\times10^{19}$ $cm^{-3}$, more preferably less than or equal to $1.4\times10^{18}$ $cm^{-3}$, from the standpoint of improving the crystallinity to increase the refractive index, and further reducing any combined defect $V_{Al}$—$O_N$ to lower the absorption coefficient.

The "oxygen concentration" is a value measured by analysis based on, for example, SIMS (secondary ion mass spectroscopy).

Figure 2:
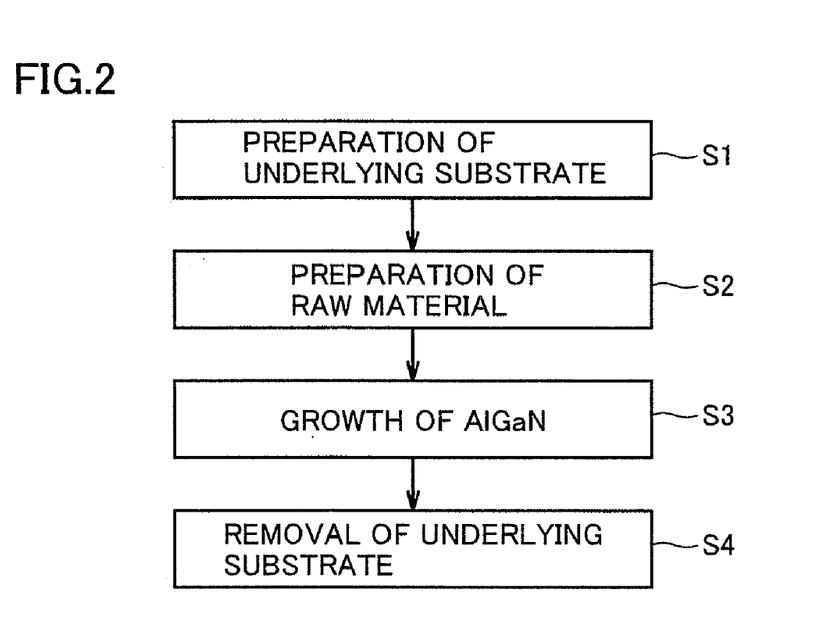
FIG. 2 is a flowchart representing a method of producing an $Al_xGa_{(1-x)}N$ single crystal according to the first embodiment of the present invention.
Figure 3:
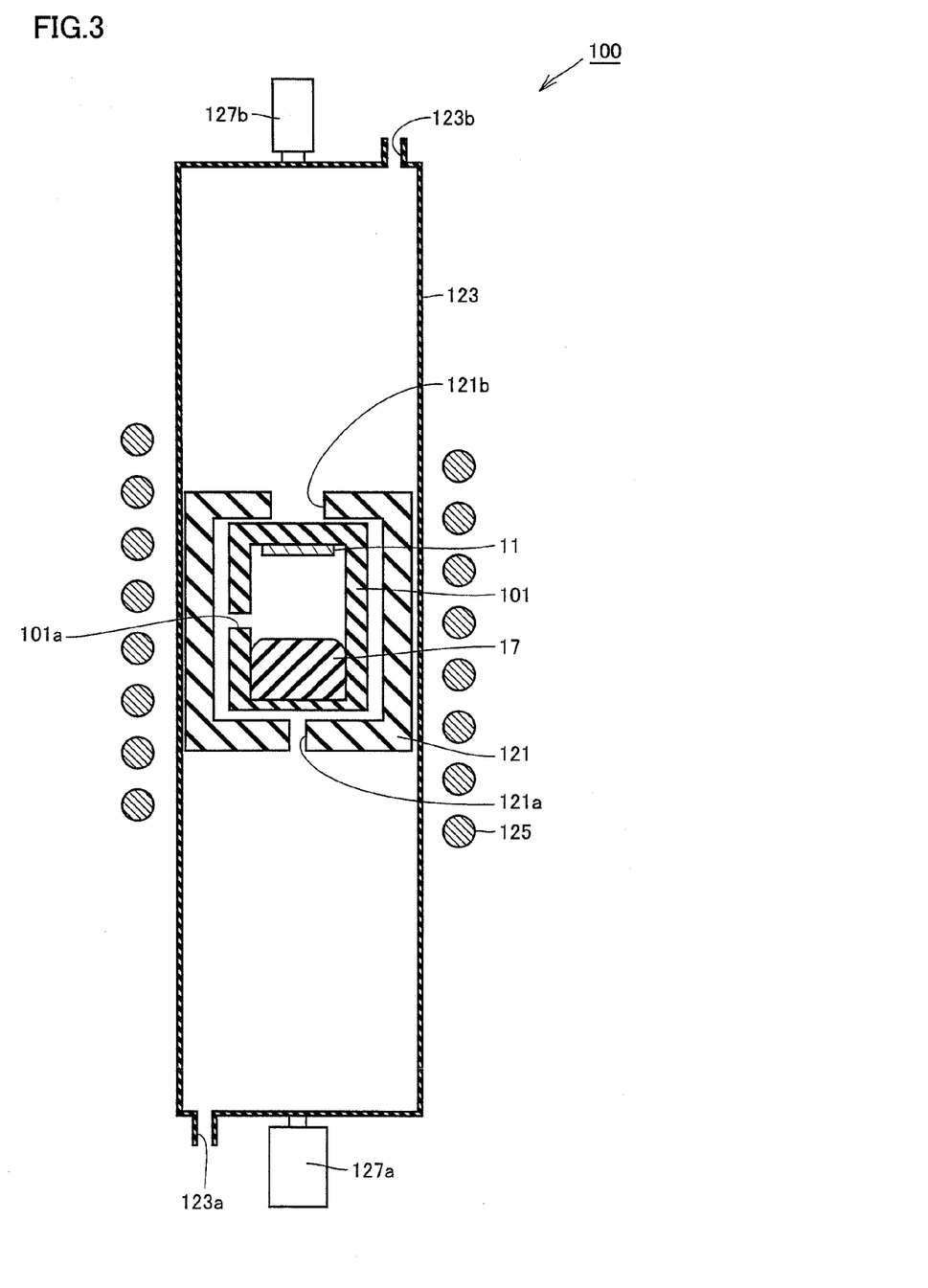
FIG. 3 shows a deposition apparatus that can be used in the production of an $Al_xGa_{(1-x)}N$ single crystal according to the first embodiment of the present invention.

Next, a method of producing an $Al_xGa_{(1-x)}N$ single crystal of the present embodiment will be described hereinafter with reference to FIGS. 2 and 3. FIG. 2 is a flowchart representing a method of producing an $Al_xGa_{(1-x)}N$ single crystal of the present embodiment. FIG. 3 shows a deposition apparatus that can be used in the production of an $Al_xGa_{(1-x)}N$ single crystal of the present embodiment.

With reference to FIG. 3, the main structure of a deposition apparatus 100 of the present embodiment will be described. Deposition apparatus 100 is a device for crystal growth based on sublimation.

Referring to FIG. 3, deposition apparatus 100 mainly includes a crucible 101, a heat body 121, a reaction vessel 123, and a heater 125.

Crucible 101 includes an outlet 101a. Heat body 121 is provided around crucible 101 in a manner ensuring communication into and out from crucible 101. Reaction vessel 123 is located around heat body 121. At the outside center region of reaction vessel 123, heater 125 such as a high frequency heating coil is arranged to heat up heat body 121.

At respective one ends of heat body 121 and reaction vessel 123 are provided inlets 121a and 123a, respectively, to allow carrier gas such as nitrogen gas to flow into crucible 101 disposed in reaction vessel 123, and outlets 121b and 123b, respectively, to allow carrier gas to be output from reaction vessel 123. Furthermore, radiation thermometers 127a and 127b are provided above and below reaction vessel 123, respectively, to measure the temperature above and below crucible 101.

Deposition apparatus 100 may include various elements other than those described above. For the sake of convenience, such other elements are not depicted.

Figure 4:
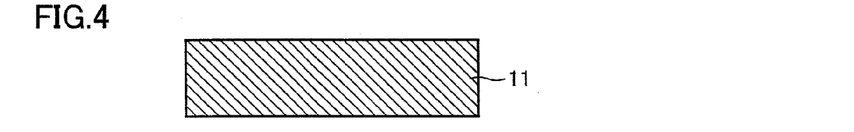
FIG. 4 is a schematic sectional view representing an underlying substrate according to the first embodiment of the present invention.

FIG. 4 is a schematic sectional view of an underlying substrate of the present embodiment. As shown in FIGS. 2-4, an underlying substrate 11 is prepared (step S1). The underlying substrate is not particularly limited, and may be a substrate of another type such as an SiC (silicon carbide) substrate. Preferably, the underlying substrate has a composition ratio x identical to that of $Al_xGa_{(1-x)}N$ single crystal 12 to be grown (refer to FIG. 5). Underlying substrate 11 is set at the upper region of crucible 101.

Then, a raw material 17 of high purity is prepared (step S2). The impurity concentration of raw material 17 is less than or equal to 0.04 wt %, preferably less than or equal to 0.025 wt %, and further preferably less than or equal to 0.01 wt %. The raw material preferably includes sintered AlN raw material. Raw material 17 does not include sintering aids. Raw material 17 is located at the lower region of crucible 101, facing underlying substrate 11.

Figure 5:
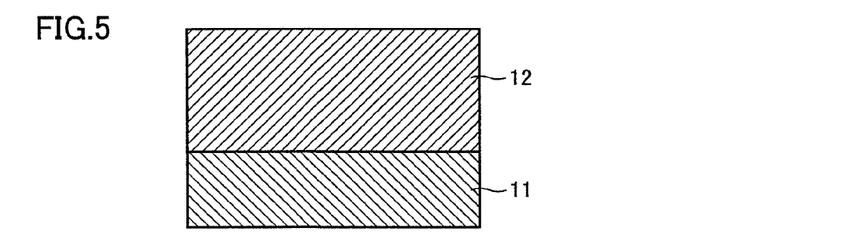
FIG. 5 is a schematic sectional view representing a grown state of an $Al_xGa_{(1-x)}N$ single crystal according to the first embodiment of the present invention.

FIG. 5 is a schematic sectional view of an $Al_xGa_{(1-x)}N$ single crystal in a grown state of the present embodiment. As shown in FIG. 5, raw material 17 is sublimated to grow an $Al_xGa_{(1-x)}N$ single crystal 12 on underlying substrate 11 (step S3). At step S3, $Al_xGa_{(1-x)}N$ single crystal 12 is grown by sublimation.

Specifically, raw material 17 is heated by heater 125 up to the sublimation temperature of raw material 17. The heating causes sublimation of raw material 17 to generate sublimation gas. The sublimation gas is solidified at the surface of underlying substrate 11 set at a temperature lower than that of raw material 17. Accordingly, $Al_xGa_{(1-x)}N$ single crystal 12 is grown on underlying substrate 11. This $Al_xGa_{(1-x)}N$ single crystal 12 has the above-described refractive index.

Then, underlying substrate 11 is removed (step S4). In the case where underlying substrate 11 has a composition ratio x identical to that of $Al_xGa_{(1-x)}N$ single crystal 12, step S4 may be omitted. In the removing step, only underlying substrate 11, or underlying substrate 11 as well as a portion of $Al_xGa_{(1-x)}N$ single crystal 12, may be removed.

The method of removing is not particularly limited. For example, a mechanical way such as cutting, grinding, or cleavage may be employed. Cutting refers to removing at least underlying substrate 11 from $Al_xGa_{(1-x)}N$ single crystal 12 by means of machinery such as a slicer or the like having a peripheral cutting edge of a diamond electrodeposition wheel. Grinding refers to grinding off the surface in the thickness direction by bringing a grindstone into contact with the surface while rotating. Cleavage refers to dividing $Al_xGa_{(1-x)}N$ single crystal 12 along a crystallite lattice plane. A chemical removing method such as etching may also be employed.

Then, both faces of $Al_xGa_{(1-x)}N$ single crystal 12 are rendered flat by grinding, polishing, and the like. This $Al_xGa_{(1-x)}N$ single crystal 12 can have its surface rendered flat readily since chaffing during polishing can be suppressed. Although the aforementioned grinding/polishing is dispensable, $Al_xGa_{(1-x)}N$ single crystal 12 is preferably rendered flat such that surface roughness RMS is less than or equal to 100 nm.

When an $Al_xGa_{(1-x)}N$ single crystal 12 having a thickness greater than or equal to 30 mm, for example, is grown, a plurality of $Al_xGa_{(1-x)}N$ single crystals 10 can be cut out from $Al_xGa_{(1-x)}N$ single crystal 12. Since $Al_xGa_{(1-x)}N$ single crystal 12 is monocrystalline, the dividing is feasible. In this case, $Al_xGa_{(1-x)}N$ single crystal 12 has favorable crystallinity, and allows reduction in the production cost.

By carrying out steps S1-S4 set forth above, an $Al_xGa_{(1-x)}N$ single crystal 10 can be produced.

$Al_xGa_{(1-x)}N$ single crystal 10 produced as set forth above has a high refractive index and low absorption with respect to light in the range of ultraviolet to deep ultraviolet range. Moreover, $Al_xGa_{(1-x)}N$ single crystal 10 can be readily machined by virtue of its property, and allows improvement in corrosion resistance against halogen gas and the like.

Since $Al_xGa_{(1-x)}N$ single crystal 10 is monocrystalline, there is almost no grain boundary such as of polycrystalline, and chaffing during grinding and polishing can be suppressed. Therefore, the loss in light transmittance can be reduced. Further, reflection of light from main surface 10a can be suppressed. Thus, the light transmittance of $Al_xGa_{(1-x)}N$ single crystal 10 can be improved.

Further, $Al_xGa_{(1-x)}N$ single crystal 10 is absent of impurities such as sintering aids required for a sintering body, due to the high purity of raw material 17. Therefore, $Al_xGa_{(1-x)}N$ single crystal 10 has higher heat conductivity than a sintered body and polycrystalline $Al_xGa_{(1-x)}N$, allowing variation in the rate of thermal expansion to be suppressed. Thus, the thermal shock resistance can be improved.

Moreover, a thick $Al_xGa_{(1-x)}N$ single crystal 10 can be obtained since it is grown by sublimation. Therefore, the strength of $Al_xGa_{(1-x)}N$ single crystal 10 can be improved.

$Al_xGa_{(1-x)}N$ single crystal 10 of the present embodiment is suitable for usage as the material of condenser lens for pickup in an optical recording and reproduction device typically represented by a DVD, a condenser lens employed in a small type solid-state imaging device, an objective lens of an ultraviolet microscope, and the like.

Second Embodiment

Figure 6:
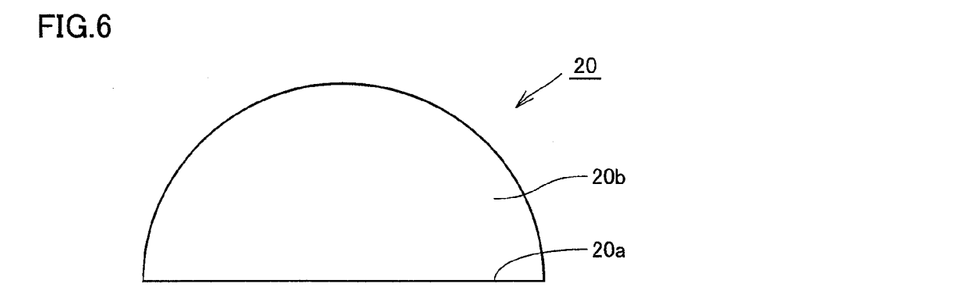
FIG. 6 is a schematic side view of a condenser lens identified as an optical lens according to a second embodiment of the present invention.

FIG. 6 is a schematic side view of a condenser lens identified as an optical lens of the present embodiment. A condenser lens 20 of the present embodiment will be described hereinafter with reference to FIG. 6. Condenser lens 20 is fabricated using $Al_xGa_{(1-x)}N$ single crystal 10 described in the first embodiment.

Referring to FIG. 6, condenser lens 20 includes a flat plane 20a, and a hemispherical round portion 20b extending from flat plane 20a. Namely, condenser lens 20 is a hemispherical type condenser lens. Flat plane 20a is a circular light incident surface in plan view, and round portion 20b is the light output surface. Flat plane 20a is preferably a (0001) plane (c plane), or a plane parallel to the (0001) plane.

Figure 7:
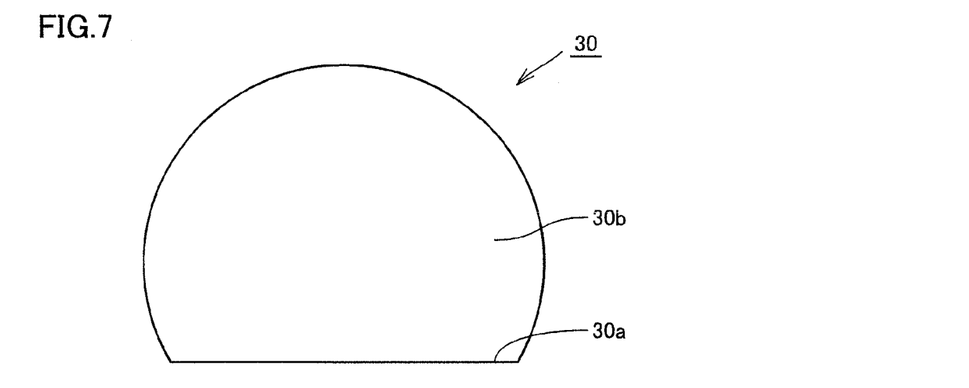
FIG. 7 is a schematic side view of a condenser lens according to a modification of the second embodiment of the present invention.

FIG. 7 is a schematic side view of a condenser lens according to a modification of the present embodiment. Referring to FIG. 7, a condenser lens 30 of the modification basically includes a structure similar to that of condenser lens 20, differing in that it is a super hemispherical condenser lens.

Specifically, condenser lens 30 includes a flat plane 30a, and a super hemispherical round portion 30b extending from flat plane 30a. Flat plane 30a is a circular light incident surface in plan view, and round portion 30b is the light output surface. Flat plane 30a is preferably a (0001) plane, or a plane parallel to the (0001) plane. Super hemispherical condenser lens 30 is advantageous in that, when having a refractive index identical to that of hemispherical condenser lens 20, the effective numerical aperture can be increased.

Figure 8:
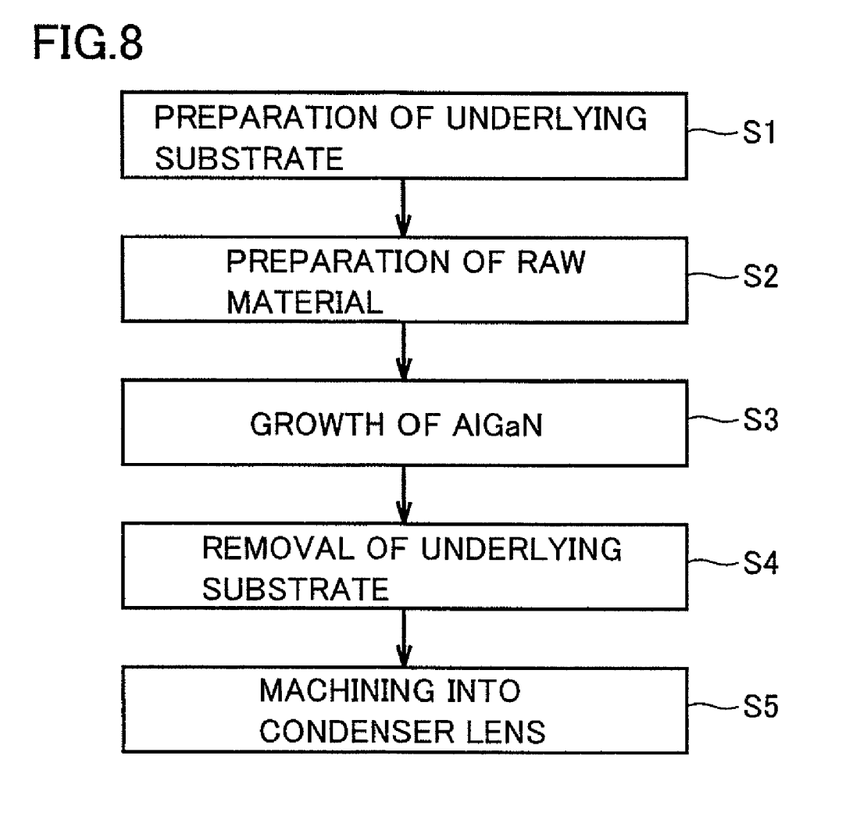
FIG. 8 is a flowchart representing a method of fabricating a condenser lens according to the second embodiment of the present invention.

A method of fabricating condenser lens 20, 30 of the present embodiment will be described hereinafter with reference to FIGS. 6-8. FIG. 8 is a flowchart representing the method of fabricating condenser lens 20, 30 of the present embodiment.

As shown in FIG. 8, first an $Al_xGa_{(1-x)}N$ single crystal 10 of the first embodiment is fabricated as set forth above (steps S1-S4).

Then, a condenser lens is fabricated using $Al_xGa_{(1-x)}N$ single crystal 10 (step S5). At this step S5, $Al_xGa_{(1-x)}N$ single crystal 10 is machined into condenser lens 20 of FIG. 6/condenser lens 30 of FIG. 7. The machining method can be carried out by, but not particularly limited to, polishing, grinding, or the like.

Since $Al_xGa_{(1-x)}N$ single crystal 10 has a hardness feasible for machining, $Al_xGa_{(1-x)}N$ single crystal can be readily machined to the configuration set forth above at step S5.

Although the present embodiment has been described based on a condenser lens as the optical lens, the present Example 1

A method of producing an $Al_xGa_{(1-x)}N$ single crystal 10 having a refractive index greater than or equal to 2.4 with respect to light at a wavelength greater than or equal to 250 nm and less than or equal to 300 nm, and a refractive index greater than or equal to 2.3 with respect to light at a wavelength greater than 300 nm and less than 350 nm, measured at 300K, was evaluated. Specifically, an $Al_xGa_{(1-x)}N$ single crystal 10 was produced according to the method of producing an $Al_xGa_{(1-x)}N$ single crystal 12 of the first embodiment.

As underlying substrate 11, a 2-inch SiC substrate was prepared (step S1). This underlying substrate 11 was set at an upper region of crucible 101 made of WC. At this stage, underlying substrate 11 was attached firmly to a lid formed of a substance identical to that of crucible 101. The main surface of underlying substrate 11 was an Si plane.

Then, raw material 17 of high purity was prepared (step S2). In step S2, impurities were reduced by first heating the prepared raw material to a temperature greater than or equal to 1500° C. and less than or equal to 2000° C. to obtain raw material 17 of high purity. Thus, an AlN sintered raw material having an impurity concentration of 0.025 wt % was prepared. This raw material 17 was arranged to face underlying substrate 11.

Then, $Al_xGa_{(1-x)}N$ single crystal 12 was grown (step S3). Specifically, the following steps were carried out.

$N_2$ gas was introduced into reaction vessel 123, and the temperature in crucible 101 was raised by means of a high frequency heating coil identified as heater 125 while controlling the amount of introduced $N_2$ gas and the output of $N_2$ such that the partial pressure of $N_2$ gas was 10 kPa to 100 kPa. Subsequent to radiation thermometer 127a measuring the temperature of crucible 101 at the raw material 17 side indicating a value reaching a defined level, power was controlled such that the $N_2$ gas partial pressure was 50 kPa, the measured temperature by radiation thermometer 127a at the raw material 17 side was 2050° C., and the temperature by radiation thermometer 127b at the underlying substrate 11 side was 1730° C. Accordingly, AlN was sublimated from raw material 17 over a deposition period of 40 hours. An AlN single crystal identified as $Al_xGa_{(1-x)}N$ single crystal 12 was grown on underlying substrate 11. Following the cooling down to room temperature, the AlN single crystal was taken out from crucible 101.

The size of this AlN single crystal was 2 inches, substantially identical to underlying substrate 11, and had a thickness of 4.3 mm. Accordingly, it was estimated that the growth rate was 108 μm/h.

Then, the underlying substrate was removed (step S4). Specifically, the obtained AlN single crystal was sliced parallel to the (0001) plane to remove underlying substrate 11, and a plurality of sheets of the substrate (AlN single crystal substrate) were obtained. Then, both faces of the AlN single crystal substrate were rendered flat by grinding. The surface was further polished by diamond abrasive processing. Thus, an AlN single crystal substrate identified as $Al_xGa_{(1-x)}N$ single crystal 10 of the present example was produced.

(Measurement Result)

This AlN single crystal substrate had its refractive index, absorption coefficient, dislocation density, oxygen concentration, surface roughness RMS and FWHM (Full Width at Half Maximum: rocking curve half-widths by X ray diffraction) measured as set forth below.

Refractive Index: At the temperature of 300K, absolute 5° reflectivity was measured through an ultraviolet-visible spectrophotometer, and the refractive index n was calculated from the reflectivity. The results showed high values. The refractive index with respect to light at a wavelength greater than or equal to 250 nm and less than or equal to 300 nm was greater than or equal to 2.40 and less than or equal to 2.60, and the refractive index with respect to light at a wavelength in the range greater than 300 nm and less than 350 nm was greater than or equal to 2.30 and less than or equal to 2.60.

Absorption Coefficient: The transmittance was measured with an ultraviolet-visible spectrophotometer, and the absorption coefficient was calculated by the thickness of the AlN single crystal substrate. The results showed low values. The absorption coefficient with respect to light at a wavelength of 250 nm, with respect to light at a wavelength of 300 nm, and with respect to light at a wavelength less than 350 nm was 142 $cm^{-1}$, 27 $cm^{-1}$, and 11 $cm^{-1}$, respectively.

Dislocation Density: Calculated by the EPD method. Specifically, the AlN single crystal substrate was immersed for 30 minutes in a melt to be etched away. This melt was KOH:NaOH (sodium hydroxide) at the ratio of 1:1, melted at 250° C. in a platinum crucible. Then, the AlN single crystal substrate was rinsed, and the number of etch pits per unit area generated at the surface was counted through a microscope. The result showed the low value of $1\times10^6$ $cm^{-2}$ for the dislocation density.

Oxygen Concentration: Using a 5 mm square specimen (a square region of 5 mm×5 mm) cut out from the center of the AlN single crystal substrate, the oxygen concentration was measured by SIMS. The result showed the low oxygen concentration of $1.4\times10^{18}$ $cm^{-3}$.

Surface Roughness RMS: Measured according to JIS B0601. Specifically, the surface roughness RMS at the face of the AlN single crystal substrate corresponding to the Al face side was measured within the field of view of 50 μm square (square region of 50 μm×50 μm), using an AFM (atomic force microscope). The result showed the low surface roughness RMS of 40 nm.

FWHM: The X-ray diffraction peak was measured for the (0002) plane at the flat portion of the uppermost AlN single crystal substrate. The result of the half-width of the X ray diffraction peak showed a low value of 15 arcsec, indicating a crystal of high quality.

By employing a raw material of high purity according to the present example, it was confirmed that an $Al_xGa_{(1-x)}N$ single crystal exhibiting a refractive index greater than or equal to 2.4 with respect to light at a wavelength greater than or equal to 250 nm and less than or equal to 300 nm, and a refractive index greater than or equal to 2.3 with respect to light at a wavelength greater than 300 nm and less than 350 nm can be implemented.

Example 2

The effect of an optical lens fabricated using an $Al_xGa_{(1-x)}N$ single crystal having a refractive index greater than or equal to 2.4 with respect to light at a wavelength greater than or equal to 250 nm and less than or equal to 300 nm, and a refractive index greater than or equal to 2.3 with respect to light at the wavelength greater than 300 nm and less than 350 nm, measured at 300K, was evaluated.

(Case 1 of Present Invention)

An optical lens was fabricated based on a well-known method, employing the $Al_xGa_{(1-x)}N$ single crystal obtained in Example 1. The shape was a hemispherical lens as shown in FIG. 6, including a flat plane 20a corresponding to the c plane of single crystal. In accordance thereto, an optical lens of Case 1 of the present invention was fabricated.

(Case 2 of Present Invention)

In Case 2 of the present invention, an AlN substrate was prepared as underlying substrate 11. The impurity concentration of the AlN sintered raw material prepared as raw material 17 was 0.008 wt %. All the other conditions were identical to those of Example 1 for crystal growth. As a result, an AlN single crystal 5.0 mm thick was obtained.

Crystal evaluation was carried out on the AlN single crystal of Case 2 of the present invention, likewise with Example 1. The results are shown in Table 1. It was confirmed in Case 2 of the present invention that the dislocation density and oxygen concentration were decreased, as compared to Case 1 of the present invention. With regards to the optical properties, the refractive index was higher in average, and the absorption coefficient was lower, as compared to Case 1 of the present invention. A likely reason is the usage of an AlN substrate based on a composition identical to that of the underlying substrate and the further improvement of the impurity concentration of the raw material.

Then, an optical lens was fabricated based on a well-known method, employing the $Al_xGa_{(1-x)}N$ single crystal obtained in Case 2 of the present invention. The shape was a super hemispherical lens as shown in FIG. 7, including a flat plane 30a corresponding to the c plane of single crystal.

(Case 3 of Present Invention)

In Case 3 of the present invention, an optical lens was fabricated based on a well known method, employing the $Al_xGa_{(1-x)}N$ single crystal obtained in Example 1. The shape was a hemispherical lens as shown in FIG. 6, including a flat plane 20a corresponding to the m plane of single crystal.

Comparative Example 1

In Comparative Example 1, an AlN substrate was prepared for underlying substrate 11. The impurity concentration of the AlN sintered raw material prepared as raw material 17 was 0.05 wt %. The remaining elements were similar to those of Example 1 for crystal growth. As a result, an AlN single crystal 5.0 mm thick was obtained.

For the AlN single crystal of Comparative Example 1, crystal evaluation likewise with Example 1 was carried out. The results are shown in Table 1. In Comparative Example 1, the dislocation density was lower than that of Case 1 of the present invention and higher than that of Case 2 of the present invention. It was also confirmed that the oxygen concentration was increased as compared to those of Case 1 and Case 2 of the present invention. A likely reason is the usage of an AlN substrate based on a composition identical to that of the underlying substrate and the high impurity concentration of the raw material. With regards to the optical characteristics, the refractive index became lower, and the absorption coefficient was increased, as compared to those of Cases 1-3 of the present invention. A likely reason thereof is the high impurity concentration of the raw material.

Then, an optical lens was fabricated based on a well-known method, employing the $Al_xGa_{(1-x)}N$ single crystal obtained in Comparative Example 1. The shape was a hemispherical lens as shown in FIG. 6, including a flat plane 20a corresponding to the c plane of single crystal.

(Method of Measurement)

With regards to the transparency of the optical lens of Cases 1 to 3 of the present invention and Comparative Example 1, the ratio of transmittance of incident light to the optical lens was identified. The results are shown in Table 1 below. Table 1 represents the groups of A, B and C in the order of higher transparency. The lens in the group with highest transparency was A, the lens in the group with lowest transparency was C, and the lens in the group with transparency between A and C was B. The lens in the groups of A and B had superior transparency.

TABLE 1

|  |  | Case 1 of Present Invention | Case 2 of Present Invention | Case 3 of Present Invention | Comparative Example 1 |
|---|---|---|---|---|---|
| $Al_xGa_{(1-x)}N$ Single Crystal | Underlying substrate | SiC | AlN | SiC | AlN |
|  | Raw material impurity concentration | 0.025 wt % | 0.008 wt % | 0.025 wt % | 0.05 wt % |
|  | Crystal thickness | 4.3 mm | 5 mm | 4.3 mm | 5 mm |
|  | $Al_xGa_{(1-x)}N$ composition x | x = 1 | x = 1 | x = 1 | x = 1 |
|  | Refractive index greater than or equal to 250 nm and less than or equal to 300 nm | 2.40-2.60 | 2.50-2.60 | 2.40-2.60 | 2.20-2.35 |
|  | Refractive index greater than 300 nm and less than 350 nm | 2.30-2.60 | 2.45-2.60 | 2.30-2.60 | 2.10-2.30 |
|  | Absorption coefficient at 250 nm | 142 | 9.8 | 142 | 158 |
|  | Absorption coefficient at 300 nm | 27 | 2.4 | 27 | 35 |
|  | Absorption coefficient at less than 350 nm | 11 | 1.5 | 11 | 14 |
|  | Dislocation density (cm$^{-2}$) | $1 \times 10^6$ | $2 \times 10^4$ | $1 \times 10^6$ | $6 \times 10^5$ |
|  | Oxygen concentration (cm$^{-3}$) | $1.4 \times 10^{18}$ | $3.9 \times 10^{17}$ | $1.4 \times 10^{18}$ | $5.0 \times 10^{18}$ |
|  | Surface roughness RMS | 40 nm | 45 nm | 40 nm | 42 nm |
|  | Thickness | 4.3 mm | 5 mm | 4.3 mm | 5 mm |
| Optical Lens | Flat plane | c plane | c plane | m plane | c plane |
|  | Lens shape | hemispherical | super hemispherical | hemispherical | hemispherical |
|  | Transparency | B | A | B | C |
|  | Axis deviation | No | No | Yes | No |

(Measurement Result)

It is appreciated from Table 1 that the optical lens of Case 1 of the present invention was superior in transparency and had no axis deviation. The reason why the transparency of the optical lens of Case 1 of the present invention was favorable may be attributed to the high transmittance of the AlN single crystal employed in Case 1 of the present invention. Furthermore, since the (0001) plane (c plane) that is perpendicular to the optical axis, i.e. the c axis, was taken as the light incident plane, it is considered that axis deviation caused by birefringence could be suppressed.

The optical lens of Case 2 of the present invention had transparency more superior than that of Case 1 with no axis deviation, as shown in Table 1. The reason why the transparency of the optical lens of Case 2 was improved may be attributed to the high transmittance of the AlN single crystal employed in Case 2. Furthermore, since the (0001) plane (c plane) that is perpendicular to the optical axis, i.e. the c axis, was taken as the light incident plane, it is considered that axis deviation caused by birefringence could be suppressed.

The optical lens of Case 3 of the present invention had transparency of a level identical to that of Case 1, and exhibited axis deviation. Since the AlN single crystal employed in the optical lens for Case 1 and Case 3 of the present invention was the same, it is considered that the transparency of the optical lens of Case 3 was equal to that of Case 1. Furthermore, it is considered that axis deviation caused by birefringence occurred since the (0001) plane (c plane) that is perpendicular to the optical axis, i.e. the c axis, was not taken as the light incident plane.

The optical lens of Comparative Example 1 had transparency inferior to that of Cases 1-3, absent of axis deviation. The reason why the transparency of the lens became degraded may be attributed to the low transmittance of the AlN single crystal employed in Comparative Example 1. Furthermore, since the (0001) plane (c plane) that is perpendicular to the optical axis, i.e. the c axis, was taken as the light incident plane, it is considered that axis deviation caused by birefringence could be suppressed.

According to the present example, it was confirmed that an optical lens improved in transparency can be implemented by fabricating an optical lens employing an $Al_xGa_{(1-x)}N$ single crystal having a refractive index greater than or equal to 2.4 with respect to light at a wavelength greater than or equal to 250 nm and less than or equal to 300 nm, and a refractive index greater than or equal to 2.3 with respect to light at a wavelength greater than 300 nm and less than 350 nm, measured at 300K.

It should be understood that the embodiments and examples disclosed herein are illustrative and non-restrictive in every respect. The scope of the present invention is defined by the appended claims, rather than the description set forth above, and all changes that fall within limits and bounds of the claims, or equivalence thereof are intended to be embraced by the claims.

DESCRIPTION OF REFERENCE CHARACTERS

10, 12 $Al_xGa_{(1-x)}N$ single crystal, 10a main surface, 11 underlying substrate, 17 raw material, 20, 30 condenser lens, 20a, 30a flat plane, 20b, 30b round portion, 100 deposition apparatus, 101 crucible, 101a outlet, 121 heat body, 121a, 123a inlet, 121b, 123b outlet, 123 reaction vessel, 125 heater, 127a, 127b radiation thermometer.

The invention claimed is:

1. An $Al_xGa_{(1-x)}N$ ($0 < x \leq 1$) single crystal, having a refractive index greater than or equal to 2.4 with respect to light at a wavelength greater than or equal to 250 nm and less than or equal to 300 nm, and a refractive index greater than or equal to 2.3 with respect to light at a wavelength greater than 300 nm and less than 350 nm, measured at 300K.

2. The $Al_xGa_{(1-x)}N$ single crystal according to claim 1, wherein an absorption coefficient with respect to light at a wavelength greater than or equal to 300 nm and less than 350 nm is less than or equal to 27 $cm^{-1}$, measured at 300K.

3. The $Al_xGa_{(1-x)}N$ single crystal according to claim 1, wherein a dislocation density is less than or equal to $1 \times 10^6$ $cm^{-2}$.

4. The $Al_xGa_{(1-x)}N$ single crystal according to claim 1, wherein an oxygen concentration is less than or equal to $1 \times 10^{19}$ $cm^{-3}$.

5. The $Al_xGa_{(1-x)}N$ single crystal according to claim 1, including a main surface having a surface roughness RMS less than or equal to 100 nm.

6. The $Al_xGa_{(1-x)}N$ single crystal according to claim 1, wherein a width or a diameter is greater than or equal to 5 mm, and a thickness is greater than or equal to 300 μm.

7. An optical lens fabricated using the $Al_xGa_{(1-x)}N$ single crystal set forth in claim 1.

8. The optical lens according to claim 7, comprising a flat plane, and a hemispherical round portion extending from said flat plane,
   wherein said flat plane is a (0001) plane, or a plane parallel to the (0001) plane.

9. The optical lens according to claim 7, comprising a flat plane, and a super hemispherical round portion extending from said flat plane,
   wherein said flat plane is a (0001) plane, or a plane parallel to the (0001) plane.

* * * * *